United States Patent
Uehara

(10) Patent No.: US 10,802,076 B2
(45) Date of Patent: *Oct. 13, 2020

(54) OSCILLATOR, ELECTRONIC DEVICE, AND VEHICLE

(71) Applicant: Seiko Epson Corporation, Tokyo (JP)

(72) Inventor: Jun Uehara, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/506,027

(22) Filed: Jul. 9, 2019

(65) Prior Publication Data

US 2020/0018794 A1    Jan. 16, 2020

(30) Foreign Application Priority Data

Jul. 10, 2018  (JP) .................................. 2018-130438

(51) Int. Cl.

| | |
|---|---|
| *G01R 31/317* | (2006.01) |
| *H03B 5/32* | (2006.01) |
| *H03B 5/06* | (2006.01) |
| *G06F 11/30* | (2006.01) |
| *H03H 9/17* | (2006.01) |
| *G06F 1/04* | (2006.01) |
| *H03H 9/15* | (2006.01) |

(52) U.S. Cl.

CPC ........ *G01R 31/31727* (2013.01); *G06F 1/04* (2013.01); *G06F 11/30* (2013.01); *H03B 5/06* (2013.01); *H03B 5/32* (2013.01); *H03H 9/17* (2013.01); *H03H 2009/155* (2013.01)

(58) Field of Classification Search

CPC .............................................. G01R 31/31727

USPC ........................................................... 331/44

See application file for complete search history.

(56) References Cited

U.S. PATENT DOCUMENTS

| | | | |
|---|---|---|---|
| 5,657,361 A | 8/1997 | Inagaki et al. | |
| 6,333,646 B1 | 12/2001 | Tsuzuki | |
| 2005/0246586 A1* | 11/2005 | Chang .............. | G01R 31/31727 714/36 |
| 2007/0146083 A1 | 6/2007 | Hein et al. | |
| 2008/0224753 A1* | 9/2008 | Tsuji ......................... | G06F 1/04 327/292 |
| 2011/0057735 A1* | 3/2011 | Honda ...................... | G06F 1/04 331/57 |
| 2013/0266053 A1* | 10/2013 | Tazaki ...................... | G06F 1/04 375/224 |
| 2017/0302285 A1 | 10/2017 | Niwa | |
| 2020/0021243 A1* | 1/2020 | Uehara .................. | H03B 5/368 |

FOREIGN PATENT DOCUMENTS

| | | |
|---|---|---|
| JP | H08-221150 A | 8/1996 |
| JP | 2012-147171 A | 8/2012 |
| WO | WO-99-59051 A1 | 11/1999 |

* cited by examiner

*Primary Examiner* — Joseph Chang
(74) *Attorney, Agent, or Firm* — Harness, Dickey & Pierce, P.L.C.

(57) ABSTRACT

An oscillator includes a resonator, a circuit device that is electrically coupled to the resonator and generates a clock signal, and an output terminal that is electrically coupled to the circuit device and outputs the clock signal. The circuit device includes an abnormality detection circuit, and when an abnormal state is detected by the abnormality detection circuit, the circuit device changes a signal characteristic of the clock signal.

11 Claims, 10 Drawing Sheets

| | | |
|---|---|---|
| FIRST ABNORMAL STATE | ABNORMALITY IN NON-VOLATILE MEMORY | FIRST VOLTAGE |
| SECOND ABNORMAL STATE | ABNORMALITY IN EXTERNAL POWER SOURCE VOLTAGE | SECOND VOLTAGE |
| THIRD ABNORMAL STATE | ABNORMALITY IN REGULATED POWER SOURCE VOLTAGE | THIRD VOLTAGE |
| FOURTH ABNORMAL STATE | ABNORMALITY IN PROCESSING CIRCUIT | FOURTH VOLTAGE |
| ⋮ | ⋮ | ⋮ |

OSCILLATOR, ELECTRONIC DEVICE, AND VEHICLE

The present application is based on, and claims priority from, JP Application Serial Number 2018-130438, filed Jul. 10, 2018, the disclosure of which is hereby incorporated by reference herein in its entirety.

BACKGROUND

1. Technical Field

The present disclosure relates to an oscillator, an electronic device, a vehicle, and the like.

2. Related Art

In the related art, there are known oscillators such as an SPXO (Simple Packaged Crystal Oscillator), a TCXO (Temperature Compensated Crystal Oscillator), and an OCXO (Oven Controlled Crystal Oscillator). The technique disclosed in JP-A-2012-147171 is an example of the related art in which an abnormal state of an oscillation circuit of an oscillator is diagnosed. A diagnosis circuit of JP-A-2012-147171 diagnoses a frequency range of an oscillation frequency at which a frequency changes according to a control signal. Specifically, the diagnosis circuit receives the control signal, compares a comparison value which is a value based on the control signal and a predetermined limit value to each other, and generates a diagnosis output value based on the comparison result.

When an abnormal state is detected in an oscillator, there is a case in which an external device to the oscillator is to be notified of the fact that an abnormal state is detected. However, it is difficult to provide many terminals for external connection on the oscillator in accordance with a demand for minimization of devices in recent years and the number of terminals is limited. Therefore, there is a problem in that it is necessary to perform notification of an abnormal state using a limited number of terminals.

SUMMARY

An advantage of some aspects of the present disclosure is to solve at least a part of the problems described above, and the present disclosure can be implemented as the following aspects.

An aspect of the present disclosure relates to an oscillator includes a resonator, a circuit device which is electrically connected to the resonator and generates a clock signal, and an output terminal which is electrically connected to the circuit device and outputs the clock signal, in which the circuit device includes an abnormality detection circuit, and the circuit device changes a signal characteristic of the clock signal when an abnormal state is detected by the abnormality detection circuit.

DESCRIPTION OF EXEMPLARY EMBODIMENTS

Hereinafter, a detailed description will be given of a favorable embodiment of the present disclosure. The present embodiment described hereinafter is not to be wrongfully construed as limiting the content of the present disclosure described in the appended claims and not all of the configurations described in the embodiment are necessary solutions for the present disclosure.

1. Oscillator

Figure 1:
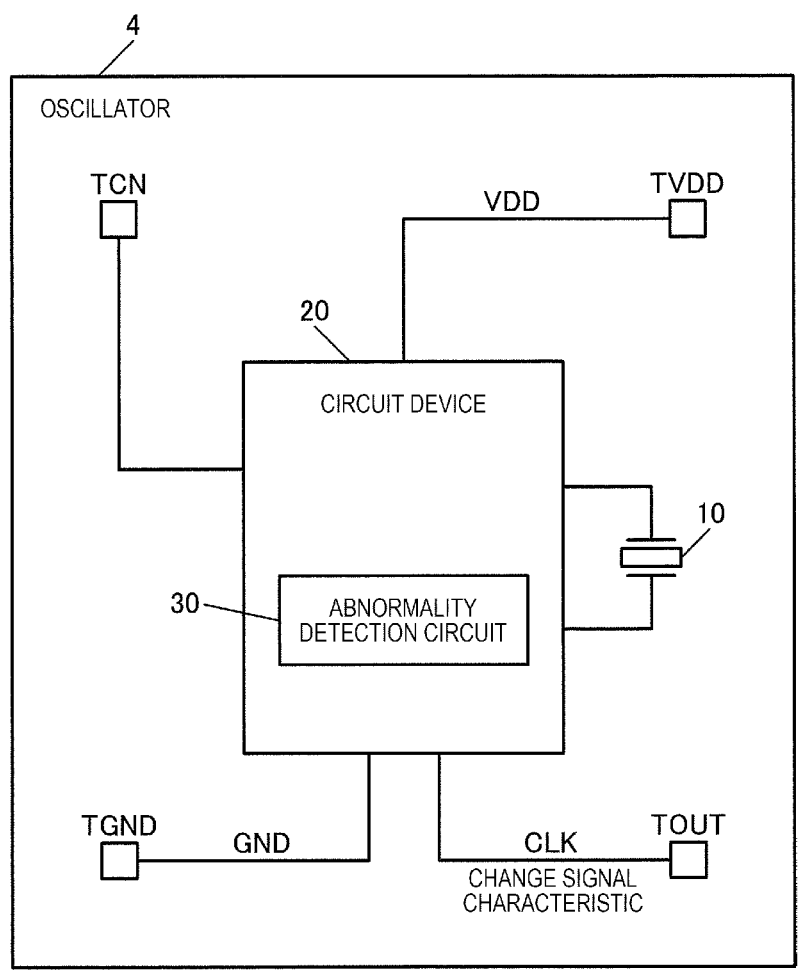
FIG. 1 is a configuration example of an oscillator of the present embodiment.

FIG. 1 illustrates a configuration example of an oscillator 4 of the present embodiment. The oscillator 4 includes a resonator 10, a circuit device 20, and an output terminal TOUT. The oscillator 4 may include a power source terminal TVDD, a ground terminal TGND, and a control terminal TCN. FIG. 1 is an example of a four-terminal oscillator 4 in which the number of terminals is 4. The number of terminals may be greater than or equal to 5, for example, the oscillator 4 may be a six-terminal oscillator 4 or the like.

Figure 11:
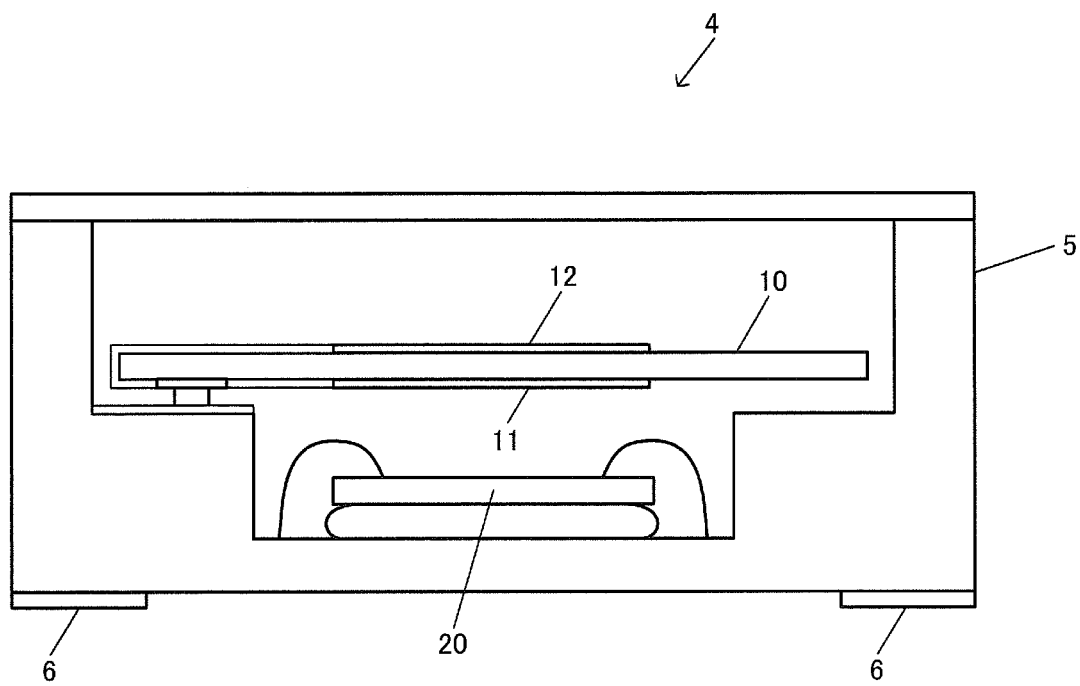
FIG. 11 is an example of a structure of the oscillator.

The power source terminal TVDD, the ground terminal TGND, the output terminal TOUT, and the control terminal TCN are terminals for external connection on the oscillator 4 and may be realized using terminals 6 which are formed on a bottom surface of a package 5 of the oscillator 4, as illustrated in FIG. 11 (described later), for example.

The power source terminal TVDD is a terminal for supplying a high potential side power source voltage VDD to the oscillator 4. The ground terminal TGND is a terminal for supplying GND, which is a ground potential, to the oscillator 4. The GND is 0 V, for example. The output terminal TOUT is a terminal for outputting a clock signal CLK. The control terminal TCN is the control terminal of the oscillator 4. For example, the control terminal TCN is an output control terminal of the clock signal CLK and is an output-enable terminal of the clock signal CLK. For example, when the control terminal TCN is set to an H level, the clock signal CLK is output from the output terminal TOUT, and when the control terminal TCN is set to an L level, the output terminal TOUT is set to a high-impedance state. In this case, the control terminal TCN is pulled up in the inner portion of the circuit device 20, for example. Alternatively, the control terminal TCN may be a frequency control terminal of the clock signal CLK. For example, a frequency control voltage is inputted to the control terminal TCN from the external device and the frequency of the clock signal CLK is variably controlled based on the control voltage that is inputted.

The power source terminal TVDD, the ground terminal TGND, the output terminal TOUT, and the control terminal TCN are electrically connected to the circuit device 20. The terminals are connected to the circuit device 20 via internal wiring, metal bumps, or the like of the package 5 of the oscillator 4 of FIG. 11 (described later). It should be noted that the connection in the present embodiment is an electrical connection. An electrical connection may be an electrical signal being connected so as to be transmittable, may be a connection in which the transmission of information according to an electrical signal is possible, and may be a connection which is made via signal lines, active elements, and the like.

The resonator 10 is an element which generates mechanical vibrations according to an electrical signal. The resonator 10 may be realized using a resonator element such as a quartz crystal resonator element, for example. For example, it is possible to realize the resonator 10 using a quartz crystal resonator element which undergoes thickness-shear vibration in which the cut angle is AT cut, SC cut, or the like. For example, the resonator 10 may be a resonator which is embedded in a TCXO (temperature compensated oscillator) not provided with a thermostat, may be a resonator which is embedded in an OCXO (Oven-Controlled Crystal Oscillator) provided with a thermostat, or the like. The resonator 10 may be an SPXO resonator. It is possible to realize the resonator 10 of the present embodiment using a resonator element other than one of a thickness-shear vibration type, and various resonator elements such as a piezoelectric resonator element which is formed by a material other than quartz crystal, for example. For example, a SAW (Surface Acoustic Wave) resonator, a MEMS (Micro Electro Mechanical Systems) resonator which serves as a silicon resonator which is formed using a silicon substrate, or the like may be adopted for the resonator 10.

The circuit device 20 is an IC (Integrated Circuit), which is manufactured using a semiconductor process, and is a semiconductor chip in which circuit elements are formed on a semiconductor substrate. The circuit device 20 is electrically connected to the resonator 10 and the output terminal TOUT. The circuit device 20 is electrically connected to the power source terminal TVDD, the ground terminal TGND, and the control terminal TCN. The circuit device 20 generates the clock signal CLK using the resonator 10. For example, the circuit device 20 causes the resonator 10 to oscillate to generate an oscillation signal and generates and outputs the clock signal CLK based on the generated oscillation signal. For example, the circuit device 20 includes an oscillation circuit 80 such as the one in FIG. 2 (described later) and generates an oscillation signal OSCK using the oscillation circuit 80 to generate the clock signal CLK. The output terminal TOUT is connected to the circuit device 20 and outputs the clock signal CLK which is generated by the circuit device 20. In other words, the output terminal TOUT outputs the generated clock signal CLK to the external device.

In the present embodiment, when the circuit device 20 detects an abnormal state, the circuit device 20 changes a signal characteristic of the clock signal CLK. Specifically, the circuit device 20 includes an abnormality detection circuit 30, and when an abnormal state is detected by the abnormality detection circuit 30, the circuit device 20 changes the signal characteristic of the clock signal CLK. The abnormality detection circuit 30 is a fault detection circuit, for example. The abnormal state is a state in which the operation or the like of the oscillator 4 is abnormal, for example, a state in which there is a fault in the oscillator 4 or the like. For example, the abnormal state is an operation state which differs from the ordinary operation state of the oscillator 4 (an operation state falling outside of specification). The abnormality detection circuit 30 monitors the operation state, the signal line state, or the like of the circuits included in the circuit device 20 and detects whether or not the circuit device 20 is in an abnormal state. When an abnormal state is detected, the circuit device 20 changes a signal characteristic such as the duty, the amplitude, or the frequency of the clock signal CLK, for example. In other words, the circuit device 20 changes the signal characteristic of the clock signal CLK to a different signal characteristic from that in an ordinary state. For example, when an abnormal state is detected, the circuit device 20 changes the duty, the amplitude, or the frequency of the clock signal CLK to a duty, an amplitude, or a frequency which are different to those in an ordinary operation state.

Accordingly, the external device of the oscillator 4 is capable of detecting that the oscillator 4 is in an abnormal state such as having a fault by monitoring the clock signal CLK which is output from the output terminal TOUT. Accordingly, even if a new terminal for detection of an abnormal state is not provided on the oscillator 4, it is possible to detect an abnormal state. Therefore, an external device such as a host device becomes capable of detecting an abnormal state such as a fault inside the oscillator 4 with a limited number of terminals of the oscillator 4 such as four terminals or six terminals and an improvement may be obtained in the reliability and the like while maintaining the compactness of the oscillator 4. Hereinafter, the description will mainly be carried out with the premise that the external device is a host device such as a microcomputer.

In the present embodiment, the notification of an abnormal state is performed by changing a signal characteristic of the clock signal CLK. Therefore, a signal characteristic such as the duty, the amplitude, or the frequency of the clock signal CLK are merely changed and the clock signal CLK does not assume a stopped state. Therefore, the host device which is supplied with the clock signal CLK to operate need not stop operating. In other words, the host device is capable of operating based on the clock signal CLK which is not stopped even while a signal characteristic thereof is changed. The host device is capable of detecting an abnormal state of the oscillator 4 and executing various processes corresponding to the abnormal state by monitoring the signal characteristic of the clock signal CLK. For example, the host device is capable of handling an abnormal state such as a severe fault using a process such as stopping the operation of the system and handling a slight abnormal state using a process such as a warning which notifies the user or the like. Therefore, it is possible to execute an appropriate process corresponding to an abnormal state and an improvement may be made in the reliability and the convenience.

Figure 2:
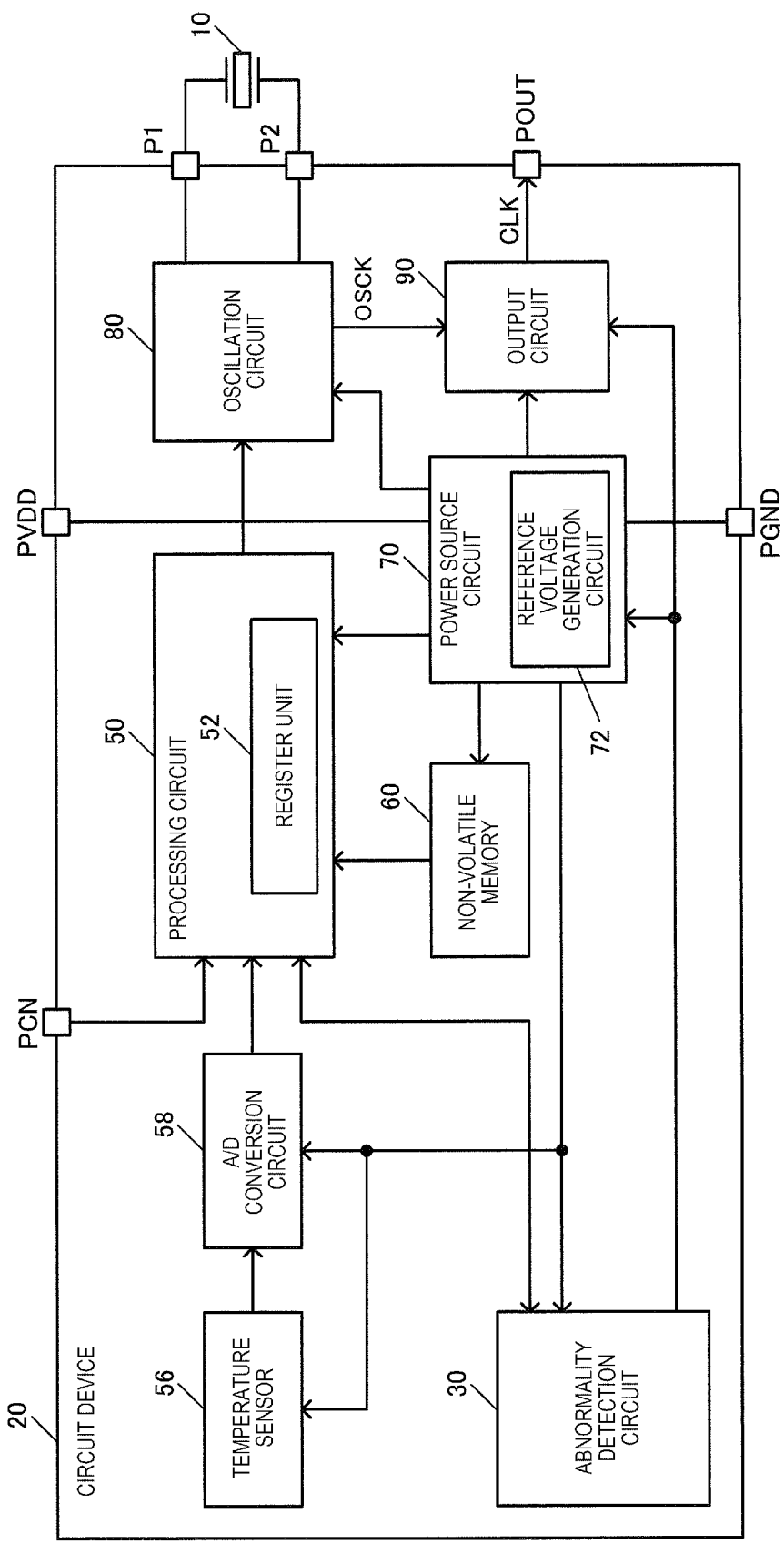
FIG. 2 is a detailed configuration example of a circuit device.

FIG. 2 illustrates a detailed configuration example of the circuit device 20. The circuit device 20 includes the abnormality detection circuit 30, a processing circuit 50, the oscillation circuit 80, and an output circuit 90. The circuit device 20 may further include a temperature sensor 56, an A/D conversion circuit 58, a non-volatile memory 60, and a power source circuit 70.

The circuit device 20 includes terminals PVDD, PGND, POUT, PCN, P1, and P2. The terminals are realized using pads of an IC which is the circuit device 20, for example. The terminals PVDD, PGND, POUT, and PCN of the circuit device 20 are connected to the power source terminal TVDD, the ground terminal TGND, the output terminal TOUT, and the control terminal TCN of the oscillator 4 of FIG. 1, respectively. The terminals P1 and P2 are terminals for the connection of the resonator 10, one end of the resonator 10 is connected to the terminal P1, and the other end of the resonator 10 is connected to the terminal P2. The connections between the resonator 10 and the terminals P1 and P2 of the circuit device 20 may be connections which are made by conductive bumps such as metal bumps. The circuit device 20 is not limited to the configuration of FIG. 2, and various modifications to the embodiment such as omitting a portion of the configuration elements and adding other configuration elements are possible.

The processing circuit 50 is a circuit which performs various processes such as digital signal processing. For example, the processing circuit 50 performs digital signal processing such as temperature compensation processing, aging compensation processing, and digital filter processing. For example, it is possible to realize the processing circuit 50 using a processor such as a DSP (Digital Signal Processor) or a CPU (Central Processing Unit), and it is possible to realize the processing circuit using a circuit such as an ASIC (Application Specific Integrated Circuit) which uses automatic placement and routing such as a gate array. For example, the processing circuit 50 may perform various digital signal processing using a program which runs on a processor.

The processing circuit 50 includes a register unit 52. The register unit 52 holds various data such as coefficient data and operation parameters for operating the circuit device 20. For example, the processing circuit 50 loads the various data such as temperature compensation coefficient data which is stored in the non-volatile memory 60 into the register unit 52 and performs various processes based on the data which is loaded into the register unit 52.

The temperature sensor 56 outputs a temperature-dependent voltage, which changes according to the temperature of the environment, as a temperature detection voltage. The temperature of the environment is, for example, the temperature of the environment in the periphery of the circuit device 20 or the resonator 10.

For example, the temperature sensor 56 generates the temperature-dependent voltage using a circuit element having temperature dependence and outputs the temperature-dependent voltage using a voltage which is not temperature-dependent as a reference. For example, the temperature sensor 56 outputs a forward voltage of a PN junction as the temperature-dependent voltage. The voltage which is not temperature-dependent is a bandgap reference voltage or the like, for example.

The A/D conversion circuit 58 subjects the temperature detection voltage from the temperature sensor 56 to A/D conversion and outputs digital temperature detection data. It is possible to adopt a sequential comparison method, a method similar to the sequential comparison method, or the like, for example, as the A/D conversion method of the A/D conversion circuit 58. A delta-sigma type, a flash type, a pipeline type, a double integral type, or the like may be adopted for the A/D conversion method.

The processing circuit 50 performs a temperature compensation process based on the temperature detection data from the A/D conversion circuit 58 and temperature compensation coefficient data. For example, the processing circuit 50 performs the temperature compensation process which compensates the temperature characteristics of the oscillation frequency and outputs frequency control data for controlling the oscillation frequency.

Specifically, the processing circuit 50 performs the temperature compensation process for canceling or suppressing fluctuations in the oscillation frequency caused by temperature changes based on the temperature detection data which changes according to the temperature and the temperature compensation coefficient data which is a coefficient of approximation. In other words, in a case in which temperature changes are present, the temperature compensation process for rendering the oscillation frequency fixed is performed.

The non-volatile memory 60 is a non-volatile memory device and is a device capable of holding and storing data even if a power source is not supplied. The non-volatile memory 60 includes a memory cell array, a driver circuit, a read-write circuit, and the like. A plurality of memory cells, a plurality of word lines, a plurality of bit lines, a plurality of source lines, and the like are disposed in the memory cell array, the driver circuit performs word line selection and the like to perform driving of the word lines and the source lines, and the read-write circuit is connected to the bit lines and performs the reading and the writing of data. The non-volatile memory 60 is EEPROM (Electrically Erasable Programmable Read Only Memory), flash memory, or the like, for example. It is possible to realize the EEPROM using floating gate type memory cells or the like, for example. It is possible to realize the flash memory using MONOS (Metal-Oxide-Nitride-Oxide-Silicon) memory cells or the like, for example. Alternatively, the non-volatile memory 60 may be a memory which uses fuse cells. In this type of memory, a fuse cell which is a memory cell includes a resistance element and a selector element which is connected in series to the resistance element. The selector element is a PN junction diode, for example. However, the selector element may be a MOS transistor. For example, one end of the resistance element is connected to the bit line and the other end of the resistance element is connected to the anode of the diode. The cathode of the diode is connected to the word line. The resistance element which functions as a fuse element is a programmable resistance in which the resistance value is variable. For example, the resistance element includes a polysilicon resistor having a high resistance value and silicide which is formed on the top layer of the polysilicon resistor and has a low resistance value. Data is stored in a fuse cell which is a memory cell by melting the silicide by causing a large current to flow in the silicide to change the resistance value of the resistance element from a low resistance value to a high resistance value.

The power source circuit 70 generates various power source voltages based on the power source voltage VDD which is supplied via the power source terminal TVDD and based on GND which is the ground potential which is supplied via the ground terminal TGND and supplies the various power supply voltages to each circuit of the circuit device 20. For example, power source voltages which are generated by regulating the power source voltage VDD using regulators are supplied to each circuit. The power source circuit 70 includes a reference voltage generation circuit 72 which generates a reference voltage. The reference voltage generation circuit 72 generates the reference voltage in which the voltage is fixed even if VDD changes. For example, the reference voltage generation circuit 72 generates the reference voltage by using a work function difference or the like of a transistor. The reference voltage generation circuit 72 may generate the reference voltage using a bandgap reference circuit.

Figure 10:
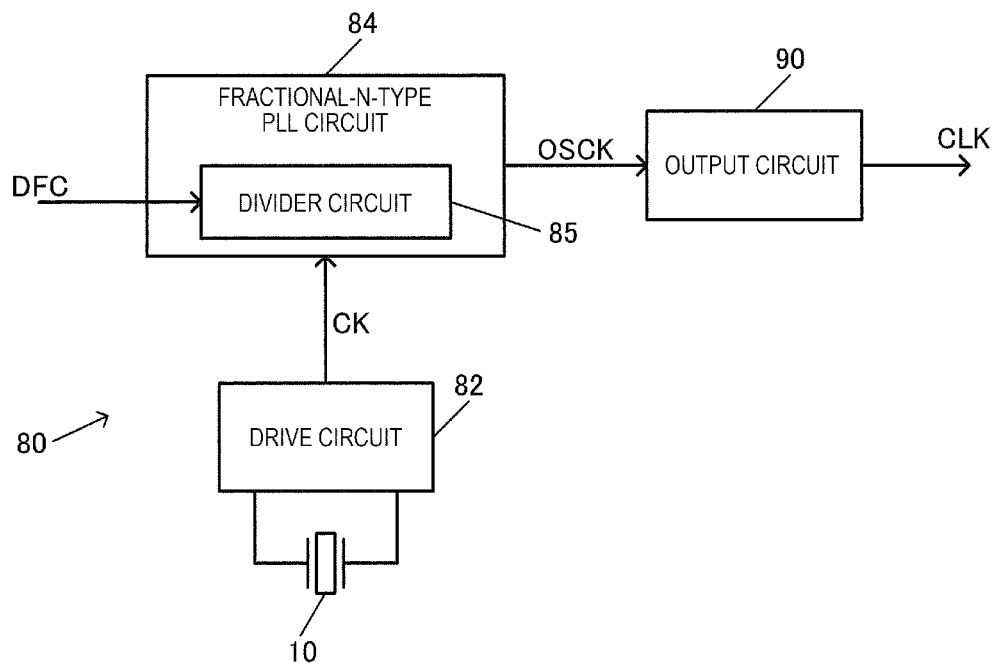
FIG. 10 is a second configuration example of the oscillation circuit.

The oscillation circuit 80 causes the resonator 10 to oscillate to generate the oscillation signal OSCK. For example, the oscillation circuit 80 which is an oscillation signal generation circuit performs the driving of the resonator 10 to generate the oscillation signal OSCK. For example, the oscillation circuit 80 includes a D/A conversion circuit and a VCO (Voltage Control Oscillator), and the D/A conversion circuit performs D/A conversion of the frequency control data which is a frequency control code from the processing circuit to output the control voltage. The VCO includes a variable-capacitance capacitor such as a varicap in which the capacitance value changes according to the control voltage and causes the resonator 10 to resonate at an oscillation frequency corresponding to the control voltage. Accordingly, the oscillation signal OSCK of the oscillation frequency which corresponds to the frequency control data is generated. The oscillation circuit 80 may be a digital oscillation circuit which uses a fractional-N-type PLL circuit 84 or the like as illustrated in FIG. 10 (described later).

The output circuit 90 performs buffering of the oscillation signal OSCK from the oscillation circuit 80 and outputs the clock signal CLK of a frequency corresponding to the oscillation frequency of the oscillation signal OSCK. The output circuit 90 may output a CMOS (Complementary Metal Oxide Semiconductor) clock signal CLK and may output a clipped sine wave clock signal CLK. The output circuit 90 may output the clock signal CLK of a differential signal such as LVDS (Low Voltage Differential Signaling) or PECL (Positive ECL). In this case, two output terminals may be provided, as in a first signal output terminal and a second signal output terminal which configure the clock signal of a differential signal.

Figure 3:
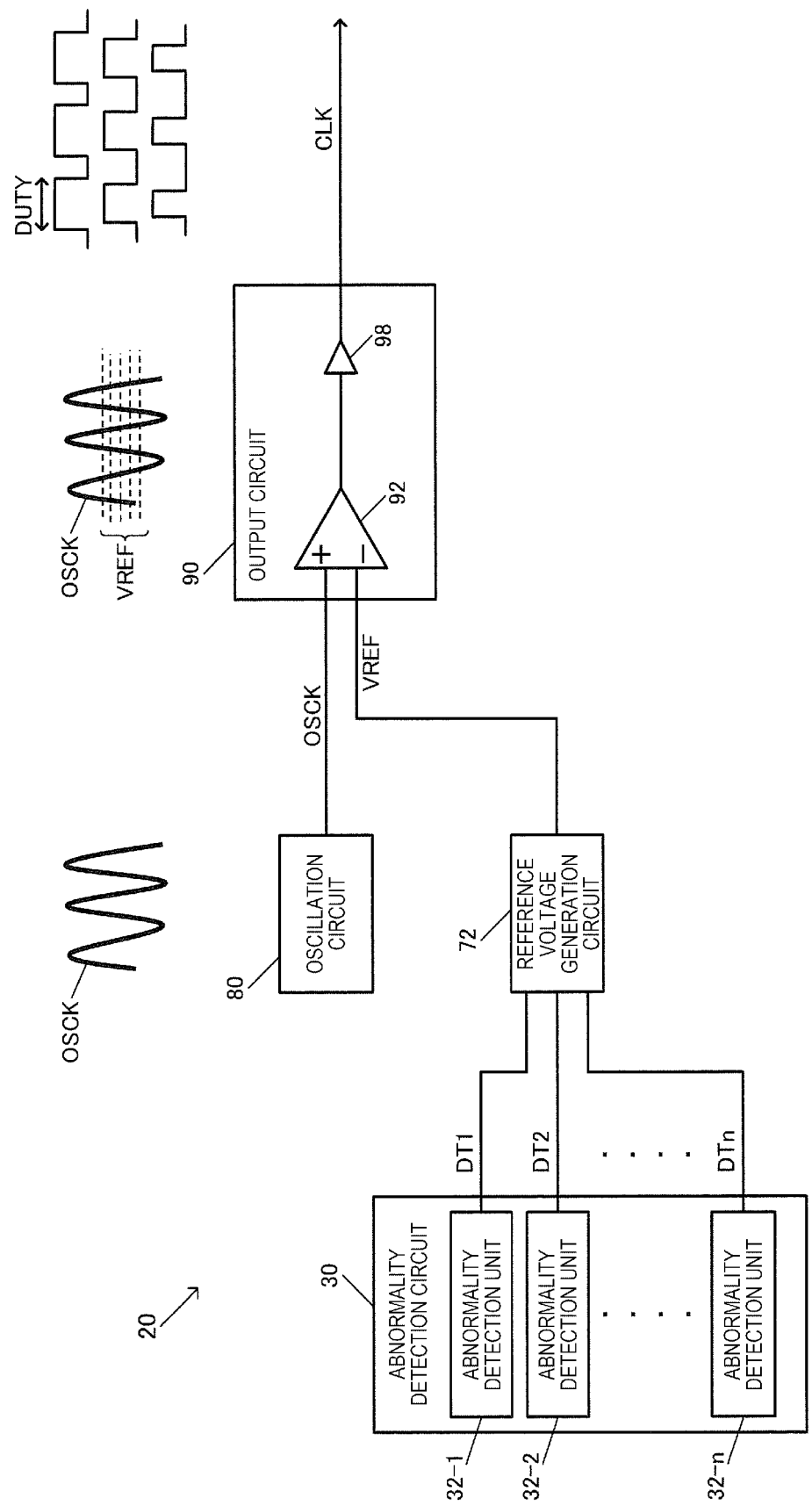
FIG. 3 is a specific configuration example of the circuit device which changes a duty of a clock signal.

The circuit device 20 of the present embodiment changes the duty of the clock signal CLK for the changing of the signal characteristic of the clock signal CLK. FIG. 3 illustrates a specific configuration example of the circuit device 20 of this case. In FIG. 3, the circuit device 20 includes the abnormality detection circuit 30, the oscillation circuit 80, the output circuit 90, and a reference voltage generation circuit 72. The abnormality detection circuit 30 outputs abnormality detection signals DT1 to DTn, the oscillation circuit 80 causes the resonator 10 to oscillate to generate the oscillation signal OSCK, the output circuit 90 outputs the clock signal CLK based on the oscillation signal OSCK, and the reference voltage generation circuit 72 generates a reference voltage VREF. The output circuit 90 includes a comparator 92 which compares the voltage level of the oscillation signal OSCK and the reference voltage VREF. The reference voltage generation circuit 72 (the oscillator 4) changes the duty of the clock signal CLK by changing the voltage level of the reference voltage VREF based on the abnormality detection signals DT1 to DTn from the abnormality detection circuit 30.

For example, the abnormality detection circuit 30 in FIG. 3 includes abnormality detection units 32-1 to 32-n which are first to nth abnormality detection units. The abnormality detection units 32-1 to 32-n detect first to nth abnormal states. Here, n is an integer greater than or equal to two. The abnormality detection units 32-1 to 32-n may be disposed together in a predetermined circuit region of the circuit device 20 and may be disposed in a distributed manner on the circuit device 20. Each of the abnormality detection units among the abnormality detection units 32-1 to 32-n includes a circuit configuration for detecting each abnormal state of the first to the nth abnormal states. The abnormality detection units 32-1 to 32-n output the abnormality detection signals DT1 to DTn. The abnormality detection signals DT1 to DTn are the first to the nth abnormality detection signals. Each of the abnormality detection signals among the abnormality detection signals DT1 to DTn is a signal which becomes active in a case in which the abnormal state is detected in each of the abnormality detection units among the abnormality detection units 32-1 to 32-n. The signal becoming active means assuming the H level in a case of positive logic and means assuming the L level in a case of negative logic.

The reference voltage generation circuit 72 receives the abnormality detection signals DT1 to DTn and generates and outputs the reference voltage VREF corresponding to the abnormality detection signals DT1 to DTn. For example, when a first abnormal state is detected by the abnormality detection unit 32-1 and DT1 which is a first abnormality detection signal becomes active, the reference voltage generation circuit 72 outputs VREF1 which is a first reference voltage as the reference voltage VREF. When a second abnormal state is detected by the abnormality detection unit 32-2 and DT2 which is a second abnormality detection signal becomes active, the reference voltage generation circuit 72 outputs VREF2 which is a second reference voltage as the reference voltage VREF. Similarly, when a third to an nth abnormal state is detected by one of the abnormality detection units 32-3 to 32-n and one of DT3 to DTn which are third to nth abnormality detection signals becomes active, the reference voltage generation circuit 72 outputs one of VREF3 to VREFn which are third to nth reference voltages as the reference voltage VREF. Here, the reference voltages VREF1 to VREFn are voltages which are different from each other, and, for example, a relationship of VREF1<VREF2<VREF3 . . . VREFn−1<VREFn is satisfied.

The output circuit 90 includes the comparator 92 and a buffer circuit 98. For example, in the comparator 92, the oscillation signal OSCK from the oscillation circuit 80 is inputted to a first input terminal which is a non-inverted input terminal and the reference voltage VREF=VREF1 to VREFn from the reference voltage generation circuit 72 is inputted to a second input terminal which is an inverted input terminal. Here, the oscillation signal OSCK is a sine-wave signal, for example, which is not wave-shaped into a square wave. The output signal of the comparator 92 is buffered by the buffer circuit 98 and is output as the clock signal CLK.

The clock signal CLK having a different duty corresponding to an abnormal state is output due to the comparator 92 comparing the voltage level of the oscillation signal OSCK and the reference voltage VREF=VREF1 to VREFn which has a different voltage corresponding to the abnormal state. For example, when the oscillation signal is a signal within a voltage range of GND to VDDA, in a case in which the reference voltage generation circuit 72 outputs VREFi=VDDA/2 as the reference voltage, the clock signal CLK having a duty of 50% is output, for example. Meanwhile, in a case in which an abnormal state is detected and the reference voltage generation circuit 72 outputs VREFi+1>VREFi (1≤i<n) as the reference voltage, the duty of the clock signal CLK is changed to a smaller duty than 50%, for example.

In FIG. 3, in a case in which an abnormal state is detected, the duty of the clock signal CLK is changed for the changing of the signal characteristic of the clock signal CLK. Accordingly, the host device which is the external device is capable of detecting an abnormal state such as a fault by monitoring the duty of the clock signal CLK. In this case, since the duty of the clock signal CLK is merely changed, the host device is capable of operating based on the clock signal CLK which is supplied from the oscillator 4 and is capable of executing an appropriate process corresponding to the abnormal state.

In FIG. 3, the reference voltage generation circuit 72 changes the duty of the clock signal CLK by changing the voltage level of the reference voltage VREF based on the abnormality detection signals DT1 to DTn. Accordingly, it is possible to change the duty of the clock signal CLK to appropriately notify the host device of an abnormal state merely by the reference voltage generation circuit 72 generating the reference voltage VREF of different voltage levels according to the abnormality detection signals DT1 to DTn.

Figure 4:
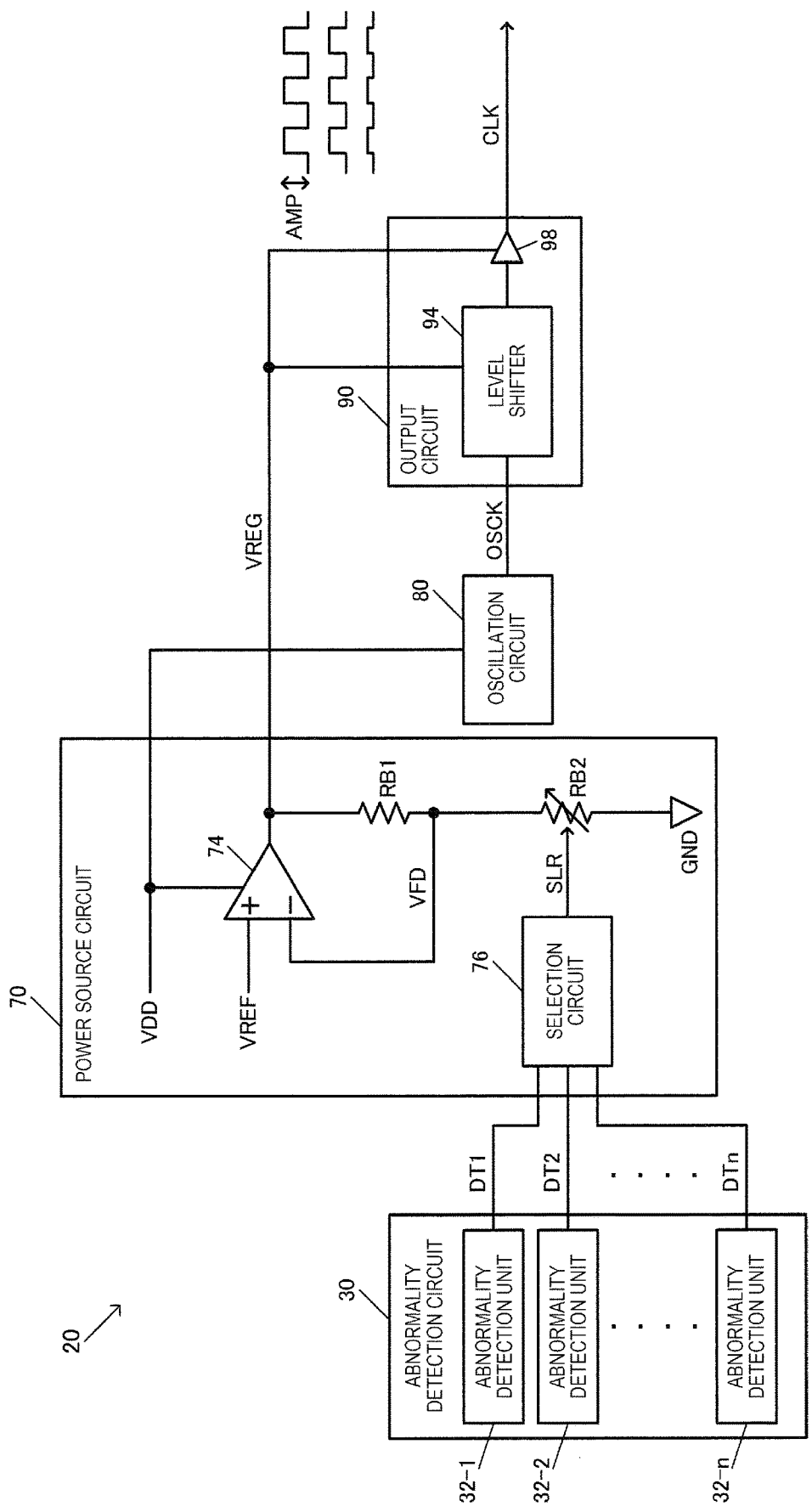
FIG. 4 is a specific configuration example of the circuit device which changes an amplitude of the clock signal.

In FIG. 4, the circuit device 20 changes the amplitude of the clock signal CLK for the changing of the signal characteristic of the clock signal CLK. Specifically, in FIG. 4, the circuit device 20 includes the abnormality detection circuit 30, the oscillation circuit 80, and the output circuit 90 in the same manner as in FIG. 3. Furthermore, the circuit device 20 includes the power source circuit 70 which supplies the power source voltage VREG to the output circuit 90. The power source circuit 70 (the oscillator 4) changes the amplitude of the clock signal CLK by changing the voltage level of the power source voltage VREG based on the abnormality detection signals DT1 to DTn. In FIG. 4, the amplitude is illustrated as AMP.

For example, in FIG. 4, the power source circuit 70 includes an operational amplifier 74, resistances RB1 and RB2, and a selection circuit 76. A regulator is configured by the operational amplifier 74 and the resistances RB1 and RB2. In the operational amplifier 74, the reference voltage VREF is input to a non-inverted input terminal which is a first input terminal and a feedback voltage VFD is input to an inverted input terminal which is a second input terminal. The resistances RB1 and RB2 are provided between an output terminal and a GND node of the operational amplifier 74. A voltage obtained by voltage dividing the power source voltage VREG, which is the output voltage of the operational amplifier 74 using the resistances RB1 and RB2, is input to the inverted input terminal of the operational amplifier 74 as the feedback voltage VFD. By adopting such a configuration, the power source voltage VREG which is obtained by regulating VDD, which is an external power source voltage, is supplied to the output circuit 90.

The output circuit 90 includes a level shifter 94 and the buffer circuit 98. The level shifter 94 changes the amplitude of the oscillation signal OSCK from the oscillation circuit 80 to an amplitude corresponding to the power source voltage VREG. For example, in a case in which the oscillation signal OSCK is a signal of an amplitude which falls within a voltage range of GND to VDD, the level shifter 94 level shifts the oscillation signal OSCK to a signal which falls within a voltage range of GND to VREG. Here, VDD>VREG. After undergoing the level shifting by the level shifter 94, the signal is buffered by the buffer circuit 98 and is output as the clock signal CLK. Accordingly, the clock signal CLK of an amplitude corresponding to the power source voltage VREG is output from the circuit device 20.

The selection circuit 76 of the power source circuit 70 receives the abnormality detection signals DT1 to DTn from the abnormality detection circuit 30 and outputs a selection signal SLR. The resistance RB2 is a variable resistance circuit and the resistance value of the resistance RB2 changes according to the selection signal SLR. For example, the variable resistance circuit which is the resistance RB2 includes a plurality of resistance elements and a plurality of switch elements which are provided to correspond to the plurality of resistance elements. The resistance value of the resistance RB2 changes due to the switch elements turning on and off based on the selection signal SLR. The voltage level of the power source voltage VREG changes due to the resistance value of the resistance RB2 changing, and thus, the amplitude of the clock signal CLK changes. In this case, the selection circuit 76 outputs the selection signal SLR which sets the resistance value of the resistance RB2 to the first to the nth resistance values according to the first to the nth abnormal states which are detected by the abnormality detection circuit 30. Accordingly, when the first to the nth abnormal states are detected, the resistance value RB2 is set to the first to the nth resistance values according to the first to the nth abnormal states and the voltage level of the power source voltage VREG is also set to the first to the nth voltage levels according to the first to the nth abnormal states. As a result, the amplitude of the clock signal CLK is set to the first to the nth amplitude according to the first to the nth abnormal states.

In FIG. 4, in a case in which an abnormal state is detected, the amplitude of the clock signal CLK is changed for the changing of the signal characteristic of the clock signal CLK. Accordingly, the host device which is the external device is capable of detecting an abnormal state such as a fault by monitoring the amplitude of the clock signal CLK. In this case, since the amplitude of the clock signal CLK is merely changed, the host device is capable of operating based on the clock signal CLK which is supplied from the oscillator 4 and is capable of executing an appropriate process corresponding to the abnormal state. In FIG. 4, the power source circuit 70 changes the amplitude of the clock signal CLK by changing the voltage level of the power source voltage VREG based on the abnormality detection signal. Accordingly, it is possible to change the amplitude of the clock signal CLK to appropriately notify the host device of an abnormal state merely by the power source circuit 70 generating the power source voltage VREG of different voltage levels according to the abnormality detection signals DT1 to DTn.

Figure 5:
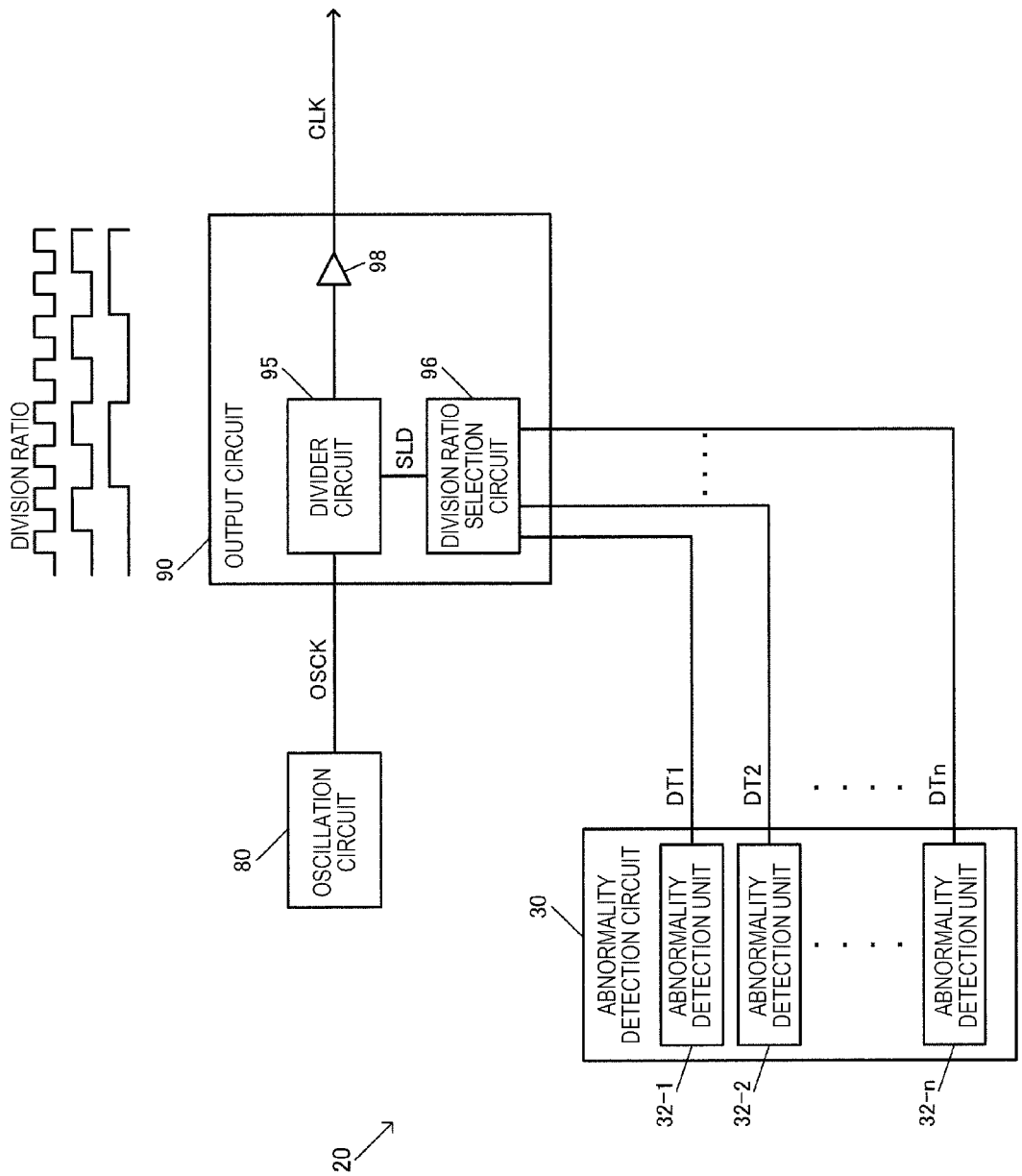
FIG. 5 is a specific configuration example of the circuit device which changes a frequency of the clock signal.

In FIG. 5, the circuit device 20 changes the frequency of the clock signal CLK for the changing of the signal characteristic of the clock signal CLK. Specifically, in FIG. 5, the circuit device 20 includes the abnormality detection circuit 30, the oscillation circuit 80, and the output circuit 90 in the same manner as in FIG. 3. The output circuit 90 includes a divider circuit 95 which divides the oscillation signal OSCK and the buffer circuit 98 which buffers the output signal of the divider circuit 95. The divider circuit 95 (the oscillator 4) changes the frequency of the clock signal CLK by changing the division ratio of the divider circuit 95 (the division ratio in the division of the oscillation signal OSCK) based on the abnormality detection signals DT1 to DTn.

For example, in FIG. 5, the output circuit 90 includes the divider circuit 95, a division ratio selection circuit 96, and the buffer circuit 98. The division ratio selection circuit 96 receives the abnormality detection signals DT1 to DTn from the abnormality detection circuit 30 and outputs a division ratio selection signal SLD. The divider circuit 95 divides the oscillation signal OSCK at the division ratio which is selected by the division ratio selection signal SLD. Accordingly, it is possible to set the frequency of the clock signal CLK to a frequency corresponding to the division ratio. In this case, the division ratio selection circuit 96 outputs the division ratio selection signal SLD which selects the division ratio corresponding to the first to the nth abnormal states which are detected by the abnormality detection circuit 30. Accordingly, when the first to the nth abnormal states are detected, the division ratio of the divider circuit 95 is set to the first to the nth division ratios according to the first to the nth abnormal states and the frequency of the clock signal CLK is set to the first to the nth frequencies corresponding to the first to the nth abnormal states.

In FIG. 5, in a case in which an abnormal state is detected, the frequency of the clock signal CLK is changed for the changing of the signal characteristic of the clock signal CLK. Accordingly, the host device which is the external device is capable of detecting an abnormal state such as a fault by monitoring the frequency of the clock signal CLK. In this case, since the frequency of the clock signal CLK is merely changed, the host device is capable of operating based on the clock signal CLK which is supplied from the oscillator 4 and is capable of executing an appropriate process corresponding to the abnormal state. In FIG. 5, the divider circuit 95 changes the frequency of the clock signal CLK by changing the division ratio in the division of the oscillation signal OSCK based on the abnormality detection signals DT1 to DTn. Accordingly, it is possible to change the frequency of the clock signal CLK to appropriately notify the host device of an abnormal state merely by the division ratio selection circuit 96 selecting the division ratio according to the abnormality detection signals DT1 to DTn.

In the present embodiment, the abnormality detection circuit 30 detects the first abnormal state and the second abnormal state which is different from the first abnormal state. When the first abnormal state is detected by the abnormality detection circuit 30, the circuit device 20 sets the value of the signal characteristic of the clock signal CLK to a first value corresponding to the first abnormal state. Meanwhile, when the second abnormal state is detected by the abnormality detection circuit 30, the circuit device 20 sets the value of the signal characteristic of the clock signal CLK to a second value corresponding to the second abnormal state.

Figures 6, 7:
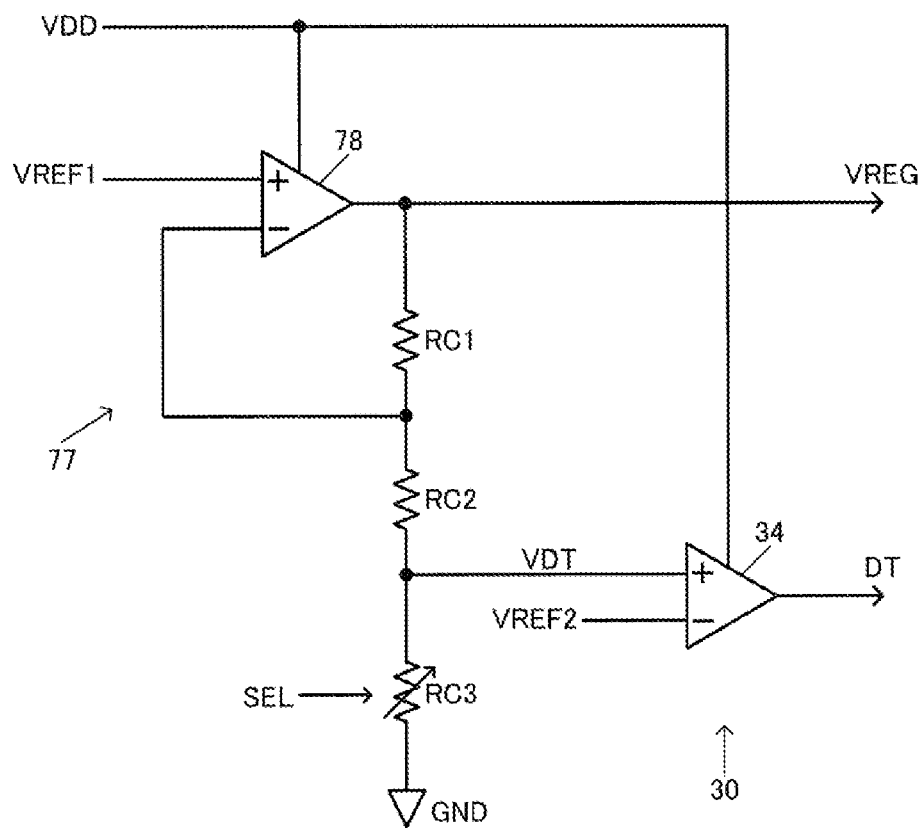
FIG. 6 is an explanatory diagram of a method of setting characteristic values of the clock signal corresponding to a plurality of abnormal states.
FIG. 7 is an explanatory diagram of a configuration example of the abnormality detection circuit.

For example, in FIG. 6, the first abnormal state is an abnormality of the non-volatile memory 60, and when the first abnormal state is detected, the value of the signal characteristic of the clock signal CLK is set to a first value.

In a case in which the signal characteristic is the duty, the amplitude, or the frequency, the duty, the amplitude, or the frequency of the clock signal CLK is set to a first duty value, a first amplitude value, or a first frequency value. The second abnormal state is an abnormality in VDD which is the external power source voltage, for example, and when the second abnormal state is detected, the duty, the amplitude, or the frequency of the clock signal CLK is set to a second duty value, a second amplitude value, or a second frequency value. A third abnormal state is an abnormality of a regulated power source voltage, for example, and a fourth abnormal state is an abnormality of the processing circuit 50, for example. Therefore, when the third or the fourth abnormal state is detected, the duty, the amplitude, or the frequency of the clock signal CLK is set to a third or a fourth duty value, a third or a fourth amplitude value, or a third or a fourth frequency value. Accordingly, due to the host device which is the external device determining the value of the signal characteristic of the clock signal CLK, it is possible to determine which of the abnormal states the oscillator 4 is in among the plurality of abnormal states, and it is possible to execute the appropriate process corresponding to each of the abnormal states.

Here, the abnormality of the non-volatile memory 60 is, for example, an abnormality of the data which is stored by the non-volatile memory 60, an abnormality in the operation of the non-volatile memory 60, or the like. Specifically, in a case in which there is an error in the data such as the temperature compensation coefficient which is stored by the non-volatile memory 60 and in a case in which there is an abnormality in the operation of the memory cells, the driver circuit, the read-write circuit, or the like of the non-volatile memory 60, the abnormality detection circuit 30 determines that the non-volatile memory 60 is in an abnormal state. For example, an error correction code such as an error detection code of parity or the like, a Hamming code, or a CRC (Cyclic Redundancy Check) is stored together with the data such as the temperature compensation coefficient in the memory cells of the non-volatile memory 60. The abnormality detection circuit 30 detects errors, or alternatively, corrects errors in the data which is stored in the memory cells based on the error detection code or the error correction code. Alternatively, a fault detection circuit of circuits such as memory cells, a driver circuit, and a read circuit is provided as the abnormality detection circuit 30 and faults caused by operation abnormalities of these circuits are detected.

Abnormalities in the external power source voltage are errors in the VDD which is the external power source voltage which is inputted via the power source terminal TVDD of FIG. 1. For example, the abnormality detection circuit 30 monitors the voltage level of VDD, and in a case in which the voltage level of VDD is less than or equal to a predetermined voltage level, for example, determines that the external power source voltage is in an abnormal state. An abnormality in a regulated power source voltage is an irregularity in VREG which is the power source voltage which is generated in a case in which the power source circuit 70 generates the power source voltage by regulating VDD which is the external power source voltage. For example, the abnormality detection circuit 30 monitors the voltage level of VREG, and in a case in which the voltage level of VREG is less than or equal to a predetermined voltage level, for example, determines that the regulated power source voltage is in an abnormal state. An abnormality in the processing circuit 50 is an abnormality in the register values of the register unit 52 of the processing circuit 50 or an abnormality in the operation state of the processing circuit 50.

For example, the processing circuit 50 controls the oscillation of the resonator 10 in the oscillation circuit 80 by generating the frequency control data and the abnormality detection circuit 30 detects an abnormality in the processing circuit 50 which performs the oscillation control. For example, the abnormality detection circuit 30 detects an abnormality in the register values by monitoring the register values of the register unit 52 and detecting whether or not there is an error in the register values. For example, an error detection code or an error correction code is stored together with the register values in the register unit 52. The abnormality detection circuit 30 detects errors, or alternatively, corrects errors in the register values which are stored in the register unit 52 based on the error detection code or the error correction code. In the present embodiment, the data of the register values which are stored in the non-volatile memory 60 is loaded into the register unit 52 and is held by the register unit 52. The register unit 52 is caused to perform a refresh operation in which the data of the register values are to be reloaded from the non-volatile memory 60. In this case, the abnormality detection circuit 30 may determine whether the data of the register values which are read from the non-volatile memory 60 match the data of the register values which are stored in the register unit 52 during the refresh operation, and in a case in which the data do not match, may determine that there is an abnormality in the register values.

FIG. 7 is an explanatory diagram of a configuration example of the abnormality detection circuit 30 in a case in which an abnormality is detected in VREG.

In FIG. 7, a regulator 77 is configured by an operational amplifier 78 and resistances RC1, RC2, and RC3. In the operational amplifier 78, VDD is supplied as the power source voltage and a reference voltage VREF is inputted to a non-inverted input terminal. An inverted input terminal of the operational amplifier 78 receives an input of a voltage which is obtained by voltage dividing VREG using the resistance RC1 and the resistances RC2 and RC3. It is possible to generate VREG which is the power source voltage in which VDD, which is the external power source voltage, is regulated by using the regulator 77 of this configuration.

The abnormality detection circuit 30 includes a comparator 34 which is realized by an operational amplifier.

The inverted input terminal of the comparator 34 receives an input of a reference voltage VREF2. VREF2 is a reference voltage of a different voltage level from VREF1. The non-inverted input terminal of the comparator 34 receives an input of a voltage VDT which is obtained by voltage dividing VREG using the resistances RC1 and RC2 and the resistance RC3. When the voltage level of VREG drops and VDT<VREF2, an output signal DT of the comparator 34 becomes active and an abnormality is detected in VREG which is the regulated power source voltage.

In FIG. 7, the resistance RC3 is a variable resistance and the resistance value of the resistance RC3 changes based on a selection signal SEL. Therefore, by causing the resistance value of the resistance RC3 to change using the selection signal SEL, it is possible to cause the voltage level which detects an abnormality in VREG to variably change.

As described above, in the present embodiment, the abnormality detection circuit 30 detects at least one of an abnormality in VDD which is the external power source voltage which is inputted via the power source terminal TVDD, an abnormality in VREG which is the power source voltage which is generated by regulating the external power source voltage, and an abnormality in the processing circuit 50 which performs the process of oscillation control. For example, the host device which is the external device is capable of detecting that the voltage level of VDD or VREG decreases and the oscillator 4 stops operating correctly due to the abnormality detection circuit 30 detecting abnormalities in the voltage levels of VDD and VREG. The host device which is the external device is capable of detecting abnormalities in the oscillation control of the resonator 10 caused by the processing circuit 50 not operating correctly due to the abnormality detection circuit 30 detecting an abnormality in the processing circuit 50. Accordingly, the host device is capable of detecting an abnormal state of the oscillator 4 and executing the appropriate process for handling the abnormal state.

Figure 8:
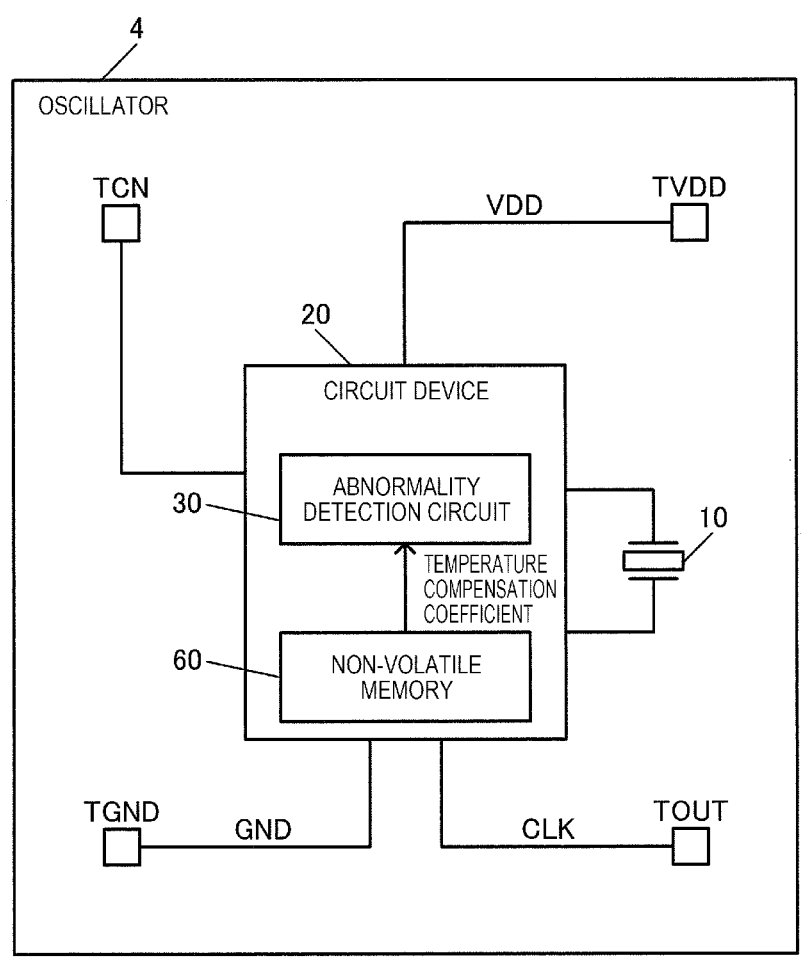
FIG. 8 is a second configuration example of the oscillator of the present embodiment.

FIG. 8 is a second configuration example of the oscillator 4 of the present embodiment. The oscillator 4 includes the resonator 10, the circuit device 20 which uses the resonator 10 to generate the clock signal CLK, the power source terminal TVDD, the ground terminal TGND, and the output terminal TOUT which outputs the clock signal CLK. The circuit device 20 includes the non-volatile memory 60, which stores the data of the temperature compensation coefficient of the frequency of the clock signal CLK, and the abnormality detection circuit 30 which detects an abnormality in the temperature compensation coefficient of the non-volatile memory 60. For example, as described earlier, each memory cell of the non-volatile memory 60 stores the data of the temperature compensation coefficient and an error detection code or an error correction code which is generated based on the data. The abnormality detection circuit 30 detects an error in the data of the temperature compensation coefficient which is read from the non-volatile memory 60 based on the error detection code or the error correction code which is read together with the data. In a case in which an error is detected, the abnormality detection circuit 30 determines that there is an abnormality in the temperature compensation coefficient of the non-volatile memory 60 and notifies the external device such as the host device. Although a method of changing the signal characteristic of the clock signal CLK as described earlier is conceivable as the method of notification, the configuration is not limited thereto. For example, the external device may be notified of the fact that there is an abnormality in the temperature compensation coefficient by the circuit device 20 outputting the abnormality detection voltage to the control terminal TCN. Alternatively, another terminal which is set for use in notification may be used to notify the external device of the fact that there is an abnormality in the temperature compensation coefficient.

In a case in which there is an abnormality in the temperature compensation coefficient, for example, although the appropriate temperature compensation process is not performed, the clock signal CLK is output as ordinary to the external device via the output terminal TOUT. For example, in a case in which the temperature compensation process is not appropriately performed, since the frequency of the clock signal CLK is within a nominal frequency range at a typical temperature such as 25° C. with no temperature fluctuation, there is a problem in that an abnormal state of the clock signal CLK may not be appropriately detected.

For example, a method of detecting a fault in which two first and second oscillators are provided in a system and the frequency of the first clock signal which is output from the first oscillator is compared to the second clock signal which is output from the second oscillator is conceivable as the method of a comparative example of the present embodiment.

In this case, even if there is an abnormality in the temperature compensation coefficient of the first oscillator, for example, it is difficult to detect an abnormality in the temperature compensation coefficient by merely comparing the frequencies of the first and the second clock signals.

With regard to this point, in the present embodiment, in a case in which there is an abnormality in the temperature compensation coefficient of the non-volatile memory 60, the abnormality detection circuit 30 detects the abnormality. The oscillator 4 notifies the external device of an abnormality in the temperature compensation coefficient using a predetermined notification method, for example. Accordingly, it is possible to notify the external device of an abnormality in the temperature compensation coefficient which is ordinarily difficult to distinguish. For example, as described above, it will be assumed that in a system which handles abnormalities in the oscillator by installing first and second oscillators, an abnormality is detected in the temperature compensation coefficient of the first oscillator, for example. In this case, a countermeasure is possible in which the first oscillator is rendered unusable and the system is operated based on the second clock signal from the second oscillator. Accordingly, further improvements to the reliability of the system may be obtained.

2. Oscillation Circuit and Oscillator

Figure 9:
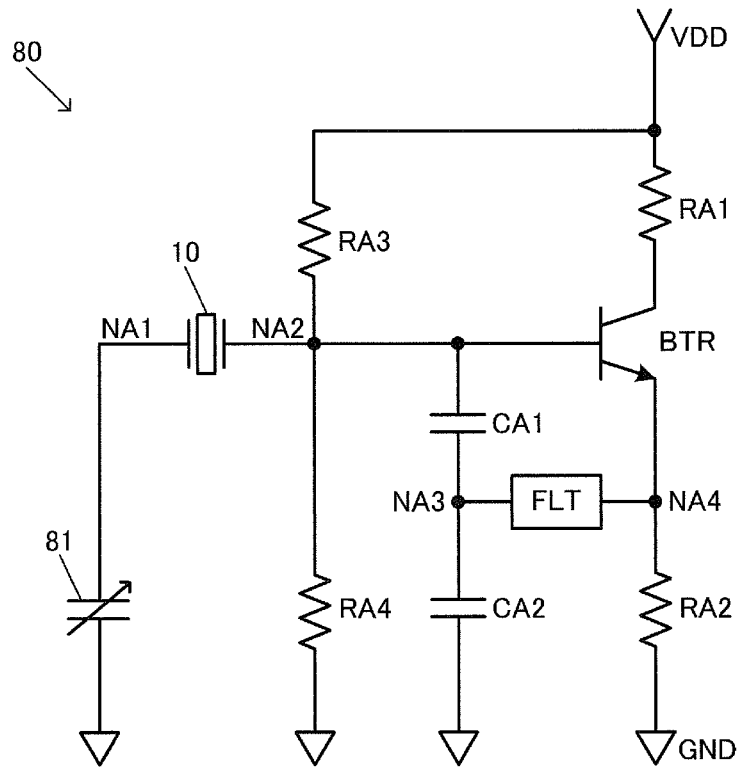
FIG. 9 is a first configuration example of an oscillation circuit.

Next, a description will be given of a specific example of the configuration of the oscillation circuit 80 and a specific example of the structure of the oscillator 4. FIG. 9 illustrates the first configuration example of the oscillation circuit 80. FIG. 9 is an example of a Colpitts-type oscillation circuit 80. A variable-capacitance capacitor 81 is provided between a node NA1 of one end of the resonator 10 and the GND node. Anode NA2 of the other end of the resonator 10 is connected to the base of a bipolar transistor BTR. A resistance RA1 is provided between the VDD node and the collector of the bipolar transistor BTR and a resistance RA2 is provided between the emitter of the bipolar transistor BTR and the GND node. A resistance RA3 is provided between the VDD node and the node NA2 and a resistance RA4 is provided between the node NA2 and the GND node. Capacitors CA1 and CA2 are provided in series between the node NA2 and the GND node and a filter FLT is provided between a connection node NA3 of the capacitors CA1 and CA2 and a node NA4 of the emitter of the bipolar transistor BTR. The oscillation circuit 80 is not limited to the configuration of FIG. 9 and various embodiments are possible, such as one in which the connection configuration is different or the like. A Piarts-type oscillation circuit may be used as the oscillation circuit 80.

FIG. 10 illustrates the second configuration example of the oscillation circuit 80. In FIG. 10, the oscillation circuit 80 includes a drive circuit 82 which performs the oscillation driving of the resonator 10 and the fractional-N-type PLL circuit 84, and the fractional-N-type PLL circuit 84 includes a divider circuit 85. The frequency control data DFC from the processing circuit 50 of FIG. 2 is inputted to the fractional-N-type PLL circuit 84. Division ratio data based on the frequency control data DFC is set in the divider circuit 85 of the fractional-N-type PLL circuit 84. For example, the division ratio data which is obtained by performing the conversion process on the frequency control data DFC is set in the divider circuit 85. The fractional-N-type PLL circuit 84 performs phase comparison on the division clock signal which is output by the divider circuit 85 and an oscillation signal CK of the resonator 10 which is generated by the oscillation operation of the resonator 10 by the drive circuit 82, generates the oscillation signal OSCK which is an oscillation clock signal, and outputs the oscillation signal OSCK to the output circuit 90. Here, in addition to the divider circuit 85, the fractional-N-type PLL circuit 84 includes a phase comparator, a charge pump circuit, a low-pass filter, a voltage control oscillation circuit, a delta-sigma modulation circuit, an adding and subtracting circuit, and the like which are not illustrated. The phase comparator subjects the oscillation signal CK from the drive circuit 82 and the division clock signal from the divider circuit 85 to phase comparison. The charge pump circuit converts the pulse voltage which is output by the phase comparator to a current. The low-pass filter smoothens the current which is output by the charge pump circuit and converts the smoothened current to a voltage. The voltage control oscillation circuit outputs the oscillation signal OSCK which is set by the oscillation frequency according to the control voltage, using the output voltage of the low-pass filter as the control voltage. The divider circuit 85 uses the output signal of the addition and subtraction circuit as an integer division ratio N to divide the frequency of the oscillation signal OSCK which is output by the voltage control oscillation circuit by an integer and outputs the division clock signal. The delta-sigma modulation circuit performs delta-sigma modulation which integrates and quantizes a fractional division ratio L/M in synchronization with the division clock signal. The addition and subtraction circuit performs addition and subtraction of the delta-sigma modulation signal which is output by the delta-sigma modulation circuit and the integer division ratio N. By using the fractional-N-type PLL circuit 84 of this configuration, it is possible to generate the oscillation signal OSCK which multiplies the oscillation signal CK of the resonator 10 by the division ratio which is represented by N+L/M.

FIG. 11 illustrates a detailed configuration example of the oscillator 4 which includes the circuit device 20 of the present embodiment. As illustrated in FIG. 11, the oscillator 4 includes the resonator 10 and the circuit device 20. The resonator 10 and the circuit device 20 are installed inside the package 5 of the oscillator 4. The pads of the IC which are the terminals of the resonator 10 and the terminals of the circuit device 20 are connected by internal wiring, metal bumps, or the like of the package 5. For example, the resonator 10 includes a lower electrode 11 and an upper electrode 12. The lower electrode 11 and the upper electrode 12 are connected to the terminals P1 and P2, which are the pads of the circuit device 20 of FIG. 2, using the internal wiring or the like of the package 5. The bottom surface of the package 5 is provided with the terminals 6 which external connection terminals of the oscillator 4. Using the configuration of FIG. 1 as an example, four of the terminals 6 are provided on the bottom surface of the oscillator 4. Specifically, the power source terminal TVDD, the ground terminal TGND, the output terminal TOUT, and the control terminal TCN are provided as the terminals 6 of the bottom surface. The power source terminal TVDD, the ground terminal TGND, the output terminal TOUT, and the control terminal TCN are connected to the pads of the IC of the circuit device 20 by the internal wiring or the like of the package 5. Specifically, the power source terminal TVDD, the ground terminal TGND, the output terminal TOUT, and the control terminal TCN are connected to the terminals PVDD, PGND, POUT, and PCN which are the pads of the circuit device 20 of FIG. 2.

The oscillator 4 may be an oscillator having an oven structure such as a double oven structure, for example. In this case, a container, a heater, and the like which serve as a thermostat are provided inside the package 5.

3. Electronic Device and Vehicle

Figure 12:
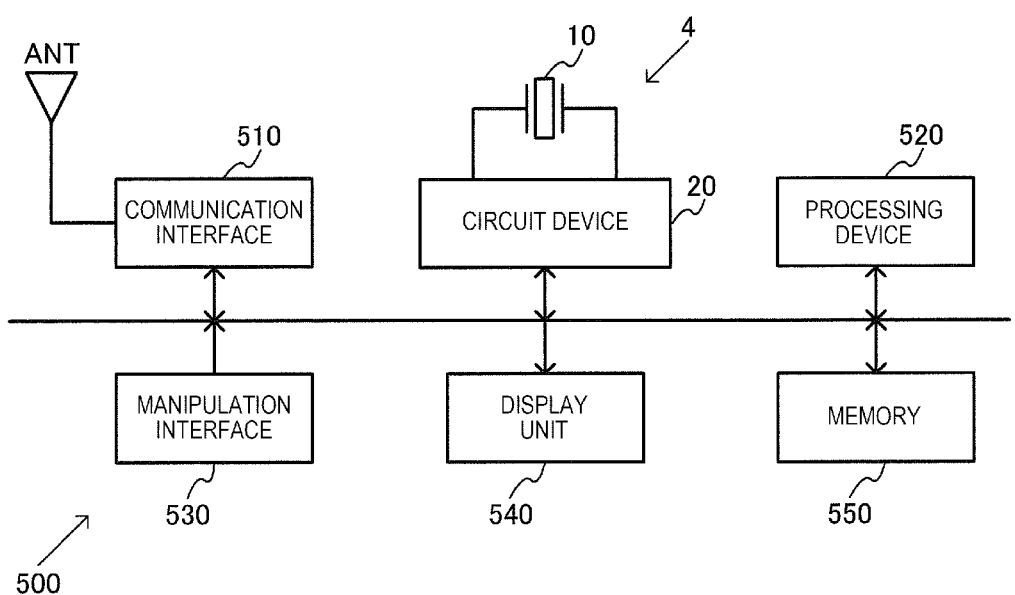
FIG. 12 is a configuration example of an electronic device.

FIG. 12 illustrates a configuration example of an electronic device 500 which includes the oscillator 4 of the present embodiment. The electronic device 500 includes the oscillator 4 of the present embodiment that includes the resonator 10 and the circuit device 20, and a processing device 520. The electronic device 500 is capable of including an antenna ANT, a communication interface 510, a manipulation interface 530, a display unit 540, and a memory 550. The oscillator 4 is configured by the resonator 10 and the circuit device 20. The electronic device 500 is not limited to the configuration of FIG. 12 and various modifications to the embodiment such as omitting a portion of the configuration elements and adding other configuration elements are possible.

For example, the electronic device 500 is a network-related device such as a base station or a router, a high-precision measurement device which measures a physical amount such as a distance, a time, a flow velocity, or a flow rate, a biological information measurement device which measures biological information, a vehicle-mounted device, or the like. The biological information measurement device is an ultrasonic measurement device, a pulse wave meter, a sphygmomanometry device, or the like, for example. The vehicle-mounted device is a device for self-driving or the like. The electronic device 500 may be a wearable device such as a head-mounted display device or a timepiecerelated device, a robot, a printing apparatus, a projecting apparatus, a portable information terminal such as a smartphone, a content provision device which delivers content, or an image device such as a digital camera or a video camera.

The communication interface 510 performs processes of receiving data from outside and transmitting data to the outside via the antenna ANT. The processing device 520 which is a processor performs the control process of the electronic device 500, various digital processing of the data which is transmitted and received via the communication interface 510, and the like. It is possible to realize the functions of the processing device 520 using a processor such as a microprocessor, for example. The manipulation interface 530 is for allowing a user to perform input manipulation and it is possible to realize the manipulation interface 530 using manipulation buttons, a touch panel display, or the like. The display unit 540 displays various information and it is possible to realize the display unit 540 using a liquid crystal, organic EL, or the like display. The memory 550 stores the data and it is possible to realize the functions of the memory 550 using semiconductor memory such as RAM or ROM.

Figure 13:
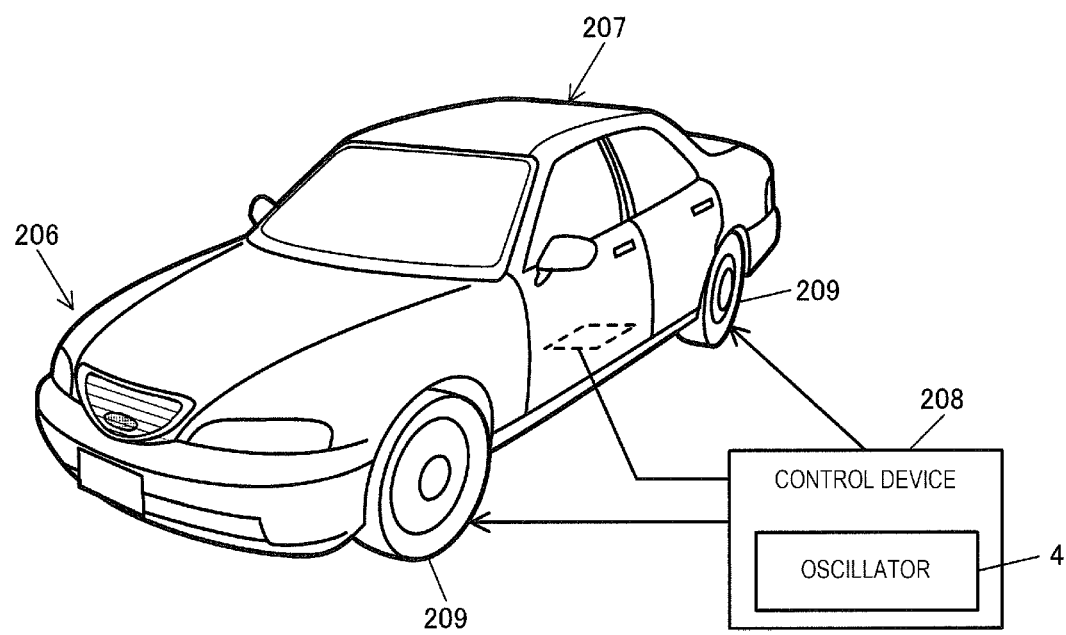
FIG. 13 is a configuration example of a vehicle.

FIG. 13 illustrates an example of a vehicle which includes the oscillator 4 of the present embodiment. It is possible to embed the oscillator 4 of the present embodiment in various vehicles such as automobiles, airplanes, motorbikes, bicycles, or ships, for example. The vehicle is provided with a drive mechanism such as an engine or a motor, a steering mechanism such as a steering wheel or a rudder, and various electronic devices, and is a device or an apparatus which moves on the ground, in the air, on the ocean, or the like. FIG. 13 schematically illustrates an automobile 206 which serves as a specific example of the vehicle. The oscillator 4 of the present embodiment which includes the resonator 10 and the circuit device 20 is embedded in the automobile 206. A control device 208 operates according to the clock signal which is generated by the oscillator 4. The control device 208 controls the firmness of the suspension according to the posture of a vehicle body 207, for example, and controls brakes of individual wheels 209. For example, self-driving of the automobile 206 may be realized by the control device 208. The device into which the oscillator 4 of the present embodiment is embedded is not limited to the control device 208, and it is possible to embed the oscillator 4 in various vehicle-mounted devices such as meter panel devices and navigation devices which are provided in a vehicle such as the automobile 206.

As described hereinabove, the oscillator of the present embodiment includes a resonator, a circuit device which is electrically connected to the resonator and generates a clock signal, and an output terminal which is electrically connected to the circuit device and outputs the clock signal. The circuit device includes an abnormality detection circuit, and when an abnormal state is detected by the abnormality detection circuit, the circuit device changes the signal characteristic of the clock signal.

According to the present embodiment, the oscillator is provided with a resonator, a circuit device which generates a clock signal, and an output terminal of the clock signal. The circuit device includes an abnormality detection circuit, and when an abnormal state is detected by the abnormality detection circuit, the circuit device changes the signal characteristic of the clock signal which is output from the output terminal. Accordingly, the external device is capable of detecting an abnormal state of the oscillator by monitoring the signal characteristic of the clock signal which is output from the output terminal. Accordingly, even if a new terminal for detection of an abnormal state is not provided on the oscillator, it is possible to detect an abnormal state and it is possible to appropriately detect an abnormal state in an oscillator having a limited number of terminals.

In the present embodiment, the circuit device may change the duty of the clock signal when the abnormal state is changed.

Accordingly, the external device is capable of detecting an abnormal state of the oscillator by monitoring the duty of the clock signal. Since the duty of the clock signal is merely changed, the external device is capable of operating based on the clock signal which is supplied from the oscillator.

In the present embodiment, the circuit device may include an oscillation circuit which causes the resonator to oscillate to generate an oscillation signal, an output circuit which outputs the clock signal based on the oscillation signal, and a reference voltage generation circuit which generates a reference voltage. The output circuit may include a comparator which compares a voltage level of the oscillation signal and the reference voltage to each other, and the duty of the clock signal may be changed by changing a voltage level of the reference voltage based on an abnormality detection signal from the abnormality detection circuit.

Accordingly, it is possible to change the duty of the clock signal to appropriately notify the external device of an abnormal state merely by the reference voltage generation circuit generating the reference voltage of different voltage levels according to the abnormality detection signal.

In the present embodiment, the circuit device may change the amplitude of the clock signal when the abnormal state is detected.

Accordingly, the external device is capable of detecting an abnormal state of the oscillator by monitoring the amplitude of the clock signal. Since the amplitude of the clock signal is merely changed, the external device is capable of operating based on the clock signal which is supplied from the oscillator.

In the present embodiment, the circuit device may include an oscillation circuit which causes the resonator to oscillate to generate an oscillation signal, an output circuit which outputs the clock signal based on the oscillation signal, and a power source circuit which supplies a power source voltage to the output circuit. The amplitude of the clock signal may be changed by changing the voltage level of the power source voltage based on the abnormality detection signal from the abnormality detection circuit.

Accordingly, it is possible to change the amplitude of the clock signal to appropriately notify the external device of an abnormal state merely by the power source circuit generating power source voltages of different voltage levels according to the abnormality detection signal.

In the present embodiment, the circuit device may change the frequency of the clock signal when the abnormal state is detected.

Accordingly, the external device is capable of detecting an abnormal state of the oscillator by monitoring the frequency of the clock signal. Since the frequency of the clock signal is merely changed, the external device is capable of operating based on the clock signal which is supplied from the oscillator.

In the present embodiment, the circuit device may include an oscillation circuit which causes the resonator to oscillate to generate an oscillation signal, and an output circuit which outputs the clock signal based on the oscillation signal. The output circuit may include a divider circuit which divides the oscillation signal, and a buffer circuit which buffers an output signal of the divider circuit, and the frequency of the clock signal may be changed by changing a division ratio of the divider circuit based on an abnormality detection signal from the abnormality detection circuit.

Accordingly, it is possible to change the frequency of the clock signal to appropriately notify the external device of an abnormal state merely by the divider circuit in which the division ratio is set according to the abnormality detection signal performing division of the oscillation signal.

In the present embodiment, the abnormality detection circuit may detect a first abnormal state and a second abnormal state which is different from the first abnormal state. When the first abnormal state is detected by the abnormality detection circuit, the circuit device may set a value of the signal characteristic of the clock signal to a first value corresponding to the first abnormal state and when the second abnormal state is detected by the abnormality detection circuit, the circuit device may set a value of the signal characteristic of the clock signal to a second value corresponding to the second abnormal state.

Accordingly, due to the external device determining the value of the signal characteristic of the clock signal, it is possible to determine which of the abnormal states the oscillator is in among the plurality of abnormal states such as the first or the second abnormal state, and it is possible to execute the appropriate process corresponding to each of the abnormal states.

In the present embodiment, the abnormality detection circuit may detect at least one of an abnormality in an external power source voltage which is inputted via the power source terminal, an abnormality in the power source voltage which is generated by regulating the external power source voltage, and an abnormality in a processing circuit which performs a process of oscillation control.

Accordingly, it is possible to detect the external power source voltage and the power source voltage or an abnormal state of the processing circuit using the abnormality detection circuit and the external device is capable of executing the appropriate process corresponding to the abnormal states.

In the present embodiment, the oscillator may further include a non-volatile memory which stores data of a temperature compensation coefficient of a frequency of the clock signal, and the abnormality detection circuit may detect an abnormality in the temperature compensation coefficient of the non-volatile memory.

Accordingly, it is possible to notify the external device of an abnormality in the temperature compensation coefficient which is ordinarily difficult to distinguish.

The oscillator of the present embodiment includes a resonator, a circuit device which is electrically connected to the resonator and generates a clock signal, and an output terminal which is electrically connected to the circuit device and outputs the clock signal. The circuit device includes the non-volatile memory, which stores the data of the temperature compensation coefficient of the frequency of the clock signal, and the abnormality detection circuit which detects an abnormality in the temperature compensation coefficient of the non-volatile memory.

According to the present embodiment, the oscillator is provided with a resonator, a circuit device which is electrically connected to the resonator and generates a clock signal, and an output terminal of the clock signal. The circuit device is provided with the non-volatile memory, which stores the data of the temperature compensation coefficient of the frequency of the clock signal, and the abnormality detection circuit which detects an abnormality in the temperature compensation coefficient. Accordingly, it is possible to use the abnormality detection circuit which is provided in the circuit device to appropriately detect an abnormality in the temperature compensation coefficient which is ordinarily difficult to distinguish.

The present embodiment relates to an electronic device including the oscillator. The present embodiment relates to a vehicle including the oscillator.

Hereinabove, although a detailed description is given of the present embodiment, a person skilled in the art is able to easily understand that many modifications not substantively departing from the novel items and effects of the present disclosure are possible. Therefore, such modification examples are all to be included in the scope of the present disclosure. For example, in the specification and the drawings, terms which appear at least once together with a more general term or a different term of a similar definition may be replaced with the different term at any location in the specification or the drawings. All combinations of the present embodiment and the modification examples are included in the scope of the present disclosure. Additionally, the configurations and operations of the oscillator, the electronic device, and the vehicle, the terminal configuration of the oscillator, the configuration of the circuit device, and the abnormality detection method are not limited to those described in the present embodiment and various embodiments are possible.

What is claimed is:

1. An oscillator comprising:
   a resonator;
   a circuit device that is electrically coupled to the resonator and generates a clock signal; and
   an output terminal that is electrically coupled to the circuit device and outputs the clock signal, wherein
   the circuit device includes an abnormality detection circuit, and the circuit device changes a signal characteristic of the clock signal when an abnormal state is detected by the abnormality detection circuit, wherein
   when the abnormal state is detected, the circuit device changes a duty of the clock signal, and
   the circuit device includes
      an oscillation circuit that causes the resonator to oscillate to generate an oscillation signal,
      an output circuit that outputs the clock signal based on the oscillation signal, and
      a reference voltage generation circuit that generates a reference voltage, the output circuit includes a comparator that compares a voltage level of the oscillation signal and the reference voltage to each other, and the duty of the clock signal is changed by changing a voltage level of the reference voltage based on an abnormality detection signal from the abnormality detection circuit.

2. An oscillator comprising:
   a resonator;
   a circuit device that is electrically coupled to the resonator and generates a clock signal; and
   an output terminal that is electrically coupled to the circuit device and outputs the clock signal, wherein
   the circuit device includes an abnormality detection circuit, and the circuit device changes a signal characteristic of the clock signal when an abnormal state is detected by the abnormality detection circuit, and
   when the abnormal state is detected, the circuit device changes an amplitude of the clock signal.

3. The oscillator according to claim 2, wherein
   the circuit device includes an oscillation circuit that causes the resonator to oscillate to generate an oscillation signal, an output circuit that outputs the clock signal based on the oscillation signal, and a power source circuit that supplies a power source voltage to the output circuit, and the amplitude of the clock signal is changed by changing a voltage level of the power source voltage based on an abnormality detection signal from the abnormality detection circuit.

4. The oscillator according to claim 1, wherein
when the abnormal state is detected, the circuit device changes a frequency of the clock signal.

5. An oscillator comprising:
a resonator;
a circuit device that is electrically coupled to the resonator and generates a clock signal; and
an output terminal that is electrically coupled to the circuit device and outputs the clock signal, wherein
the circuit device includes an abnormality detection circuit, and the circuit device changes a signal characteristic of the clock signal when an abnormal state is detected by the abnormality detection circuit, wherein
when the abnormal state is detected, the circuit device changes a frequency of the clock signal, and
the circuit device includes
an oscillation circuit that causes the resonator to oscillate to generate an oscillation signal, and
an output circuit that outputs the clock signal based on the oscillation signal, wherein the output circuit includes
a divider circuit that divides the oscillation signal, and
a buffer circuit that buffers an output signal of the divider circuit, and the frequency of the clock signal is changed by changing a division ratio of the divider circuit based on an abnormality detection signal from the abnormality detection circuit.

6. The oscillator according to claim 1, wherein
the abnormality detection circuit detects a first abnormal state and a second abnormal state that is different from the first abnormal state, and when the first abnormal state is detected by the abnormality detection circuit, the circuit device sets a value of the signal characteristic of the clock signal to a first value corresponding to the first abnormal state, and when the second abnormal state is detected by the abnormality detection circuit, the circuit device sets a value of the signal characteristic of the clock signal to a second value corresponding to the second abnormal state.

7. The oscillator according to claim 1, wherein
the abnormality detection circuit detects at least one of an abnormality in an external power source voltage that is inputted via the power source terminal, an abnormality in the power source voltage which is generated by regulating the external power source voltage, and an abnormality in a processing circuit which performs a process of oscillation control.

8. The oscillator according to claim 1, further comprising:
a non-volatile memory that stores data of a temperature compensation coefficient of a frequency of the clock signal, wherein
the abnormality detection circuit detects an abnormality in the temperature compensation coefficient of the non-volatile memory.

9. An oscillator comprising:
a resonator;
a circuit device that is electrically coupled to the resonator and generates a clock signal; and
an output terminal that is electrically coupled to the circuit device and outputs the clock signal, wherein
the circuit device includes
a non-volatile memory that stores data of a temperature compensation coefficient of a frequency of the clock signal, and
an abnormality detection circuit that detects an abnormality in the temperature compensation coefficient of the non-volatile memory.

10. An electronic device, comprising:
the oscillator according to claim 1.

11. A vehicle, comprising:
the oscillator according to claim 1.

* * * * *